(12) United States Patent
Dobashi et al.

(10) Patent No.: US 11,756,764 B2
(45) Date of Patent: Sep. 12, 2023

(54) CHARGED PARTICLE BEAM APPARATUS AND METHOD OF CONTROLLING CHARGED PARTICLE BEAM APPARATUS

(71) Applicant: HITACHI HIGH-TECH CORPORATION, Tokyo (JP)

(72) Inventors: Takashi Dobashi, Tokyo (JP); Hirokazu Tamaki, Tokyo (JP); Kuniyasu Nakamura, Tokyo (JP); Hiromi Mise, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 136 days.

(21) Appl. No.: 17/603,440

(22) PCT Filed: Apr. 23, 2019

(86) PCT No.: PCT/JP2019/017173
§ 371 (c)(1),
(2) Date: Oct. 13, 2021

(87) PCT Pub. No.: WO2020/217297
PCT Pub. Date: Oct. 29, 2020

(65) Prior Publication Data
US 2022/0216034 A1    Jul. 7, 2022

(51) Int. Cl.
*H01J 37/28*    (2006.01)
*H01J 37/20*    (2006.01)
(Continued)

(52) U.S. Cl.
CPC .............. *H01J 37/28* (2013.01); *H01J 37/20* (2013.01); *H01J 37/244* (2013.01); *H01J 37/265* (2013.01); *H01J 2237/2802* (2013.01)

(58) Field of Classification Search
CPC .......... H01J 37/28; H01J 37/20; H01J 37/244; H01J 37/265; H01J 2237/2802; H01J 2237/202; G01N 23/225
See application file for complete search history.

(56) References Cited

U.S. PATENT DOCUMENTS 5,650,621 A * 7/1997 Tsuneta ................. H01J 37/252
250/311
6,579,359 B1 * 6/2003 Mynbaeva ............ C30B 29/406
257/E21.127

(Continued)

FOREIGN PATENT DOCUMENTS

| JP | 2010-92625 A | 4/2010 |
| WO | 2016/006375 A1 | 1/2016 |
| WO | 2018/221636 A1 | 12/2016 |

*Primary Examiner* — David A Vanore
(74) *Attorney, Agent, or Firm* — Volpe Koenig

(57) ABSTRACT

A charged particle beam apparatus includes: a movement mechanism; a particle source; an optical element; a detector; and a control mechanism, in which the control mechanism acquires a diffraction pattern including a plurality of Kikuchi lines, calculates a crystal zone axis of the sample by performing analysis based on a plurality of intersections at which two Kikuchi lines included in the diffraction pattern intersect with each other, calculates an inclination angle of the sample based on the crystal zone axis and an irradiation direction of the charged particle beam, and controls the moving mechanism based on the inclination angle.

14 Claims, 15 Drawing Sheets

(51) Int. Cl.
    *H01J 37/244*     (2006.01)
    *H01J 37/26*     (2006.01)

(56) References Cited

U.S. PATENT DOCUMENTS

| | | | |
|---|---|---|---|
| 8,253,099 B2 * | 8/2012 | Nicolopoulos | H01J 37/05 250/311 |
| 8,795,446 B2 * | 8/2014 | Kaneko | C22C 9/10 148/435 |
| 9,103,769 B2 * | 8/2015 | Duden | G01N 23/205 |
| 9,978,557 B2 * | 5/2018 | Flanagan, IV | H01J 37/261 |
| 2010/0108882 A1 * | 5/2010 | Zewail | H01J 37/263 250/311 |
| 2010/0108883 A1 * | 5/2010 | Zewail | H01J 37/26 250/307 |
| 2011/0174972 A1 * | 7/2011 | Duden | H01J 37/20 250/311 |
| 2011/0192505 A1 * | 8/2011 | Kaneko | C22F 1/00 148/414 |
| 2011/0220796 A1 * | 9/2011 | Nicolopoulos | H01J 37/28 250/311 |
| 2011/0284744 A1 * | 11/2011 | Zewail | H01J 37/228 250/311 |
| 2012/0312986 A1 * | 12/2012 | Zewail | H01J 37/22 250/307 |
| 2013/0340127 A1 * | 12/2013 | Wu | G01K 11/30 850/50 |
| 2014/0318673 A1 * | 10/2014 | Kaneko | C22C 9/10 148/414 |
| 2017/0133195 A1 * | 5/2017 | Yaguchi | H01J 37/20 |
| 2017/0309441 A1 * | 10/2017 | Flanagan, IV | H01J 37/261 |
| 2020/0066481 A1 * | 2/2020 | Mori | H01J 37/2955 |

* cited by examiner

[FIG. 1]
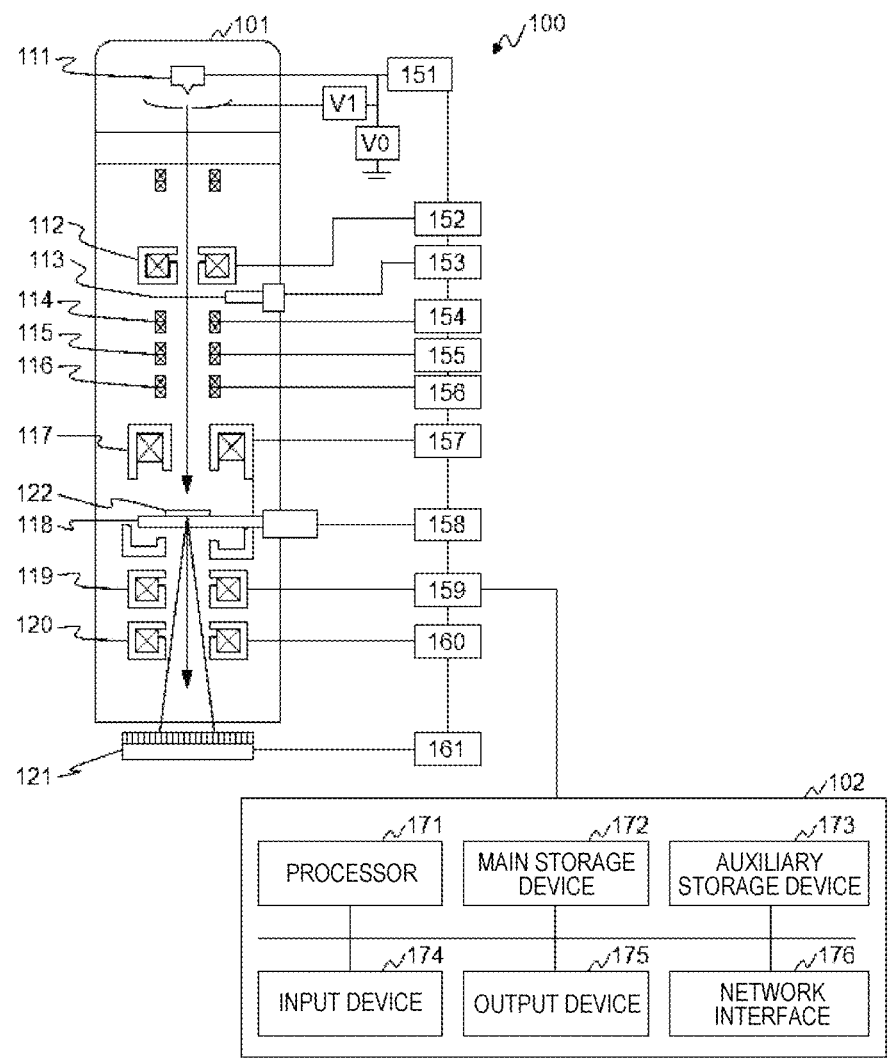

[FIG. 2]
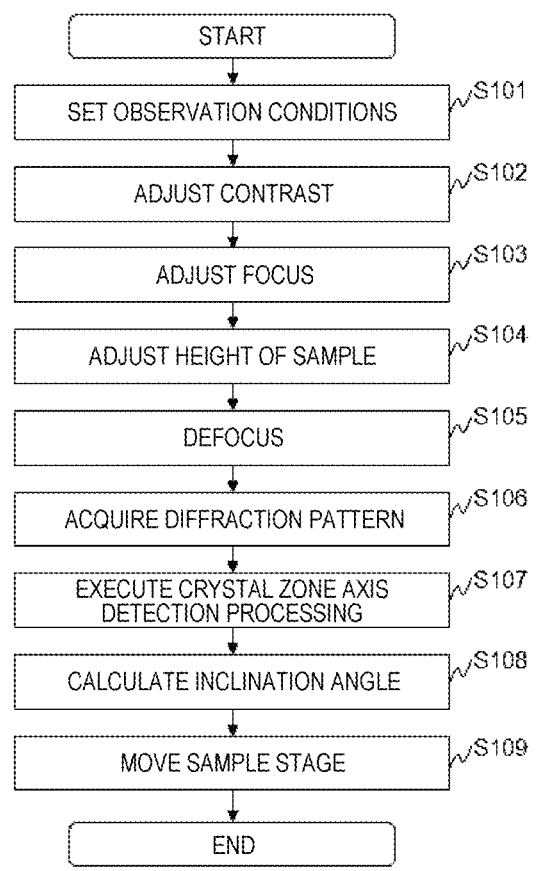

[FIG. 3A]
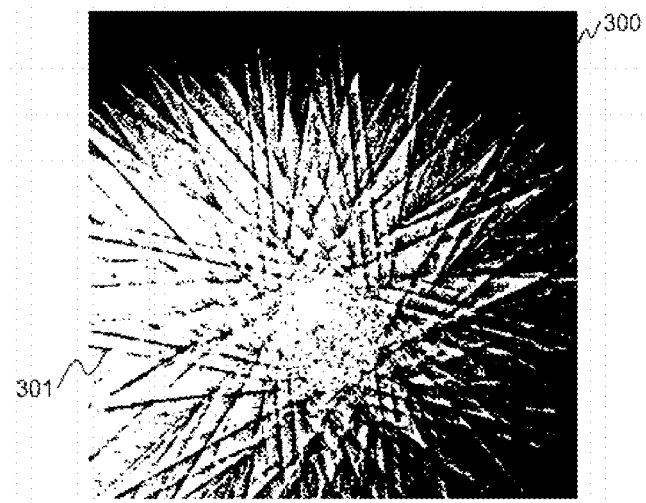
[FIG. 3B]
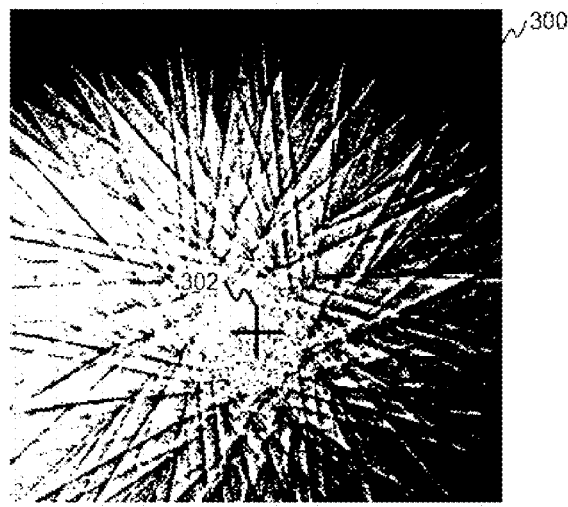

[FIG. 3C]
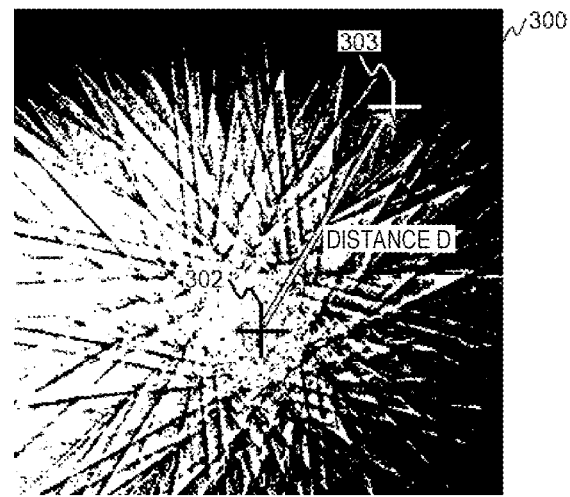
[FIG. 4A]
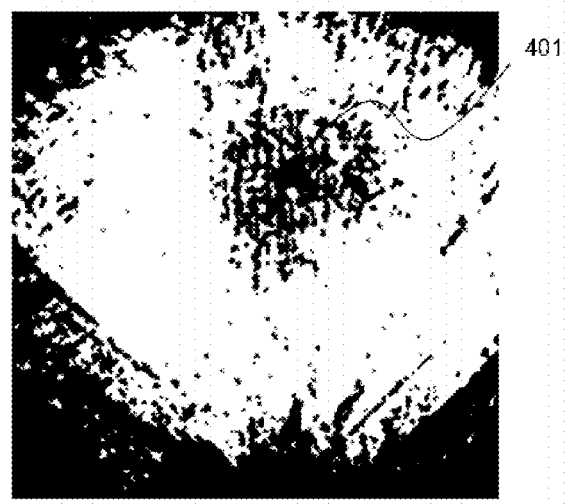

[FIG. 4B]
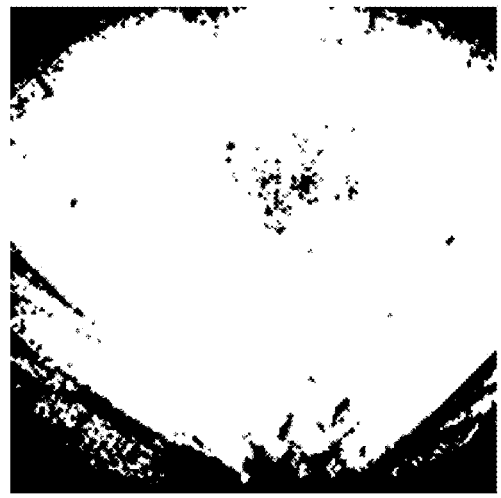
[FIG. 5]
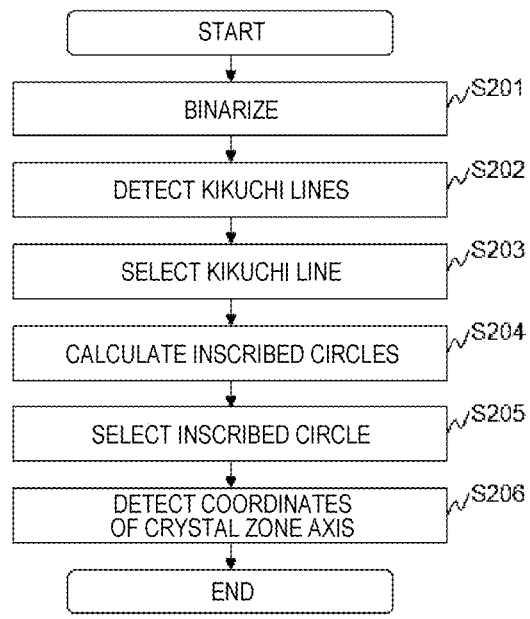

[FIG. 6A]
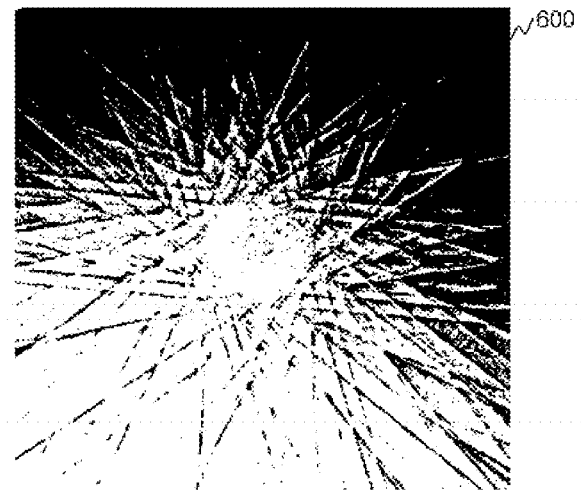
[FIG. 6B]
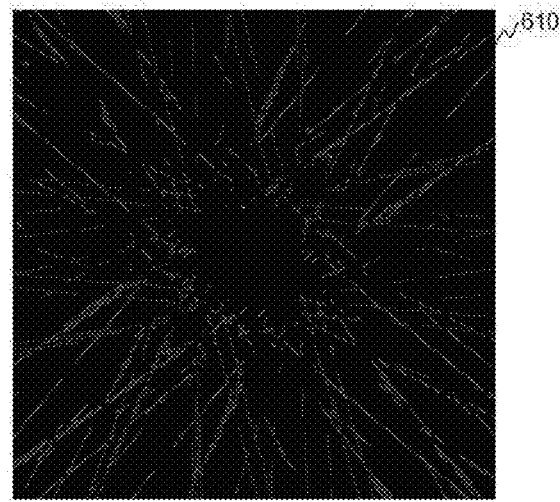

[FIG. 6C]
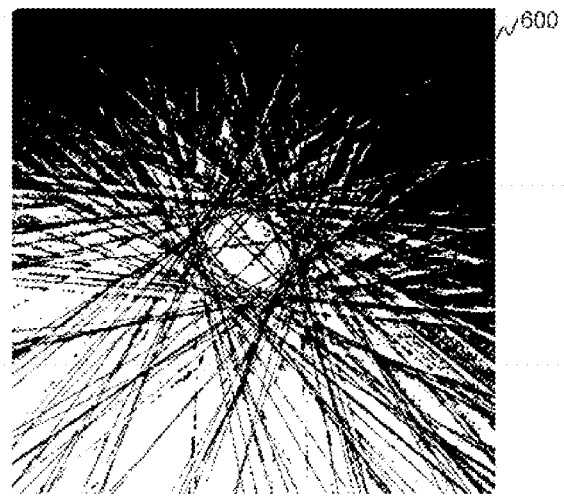
[FIG. 6D]
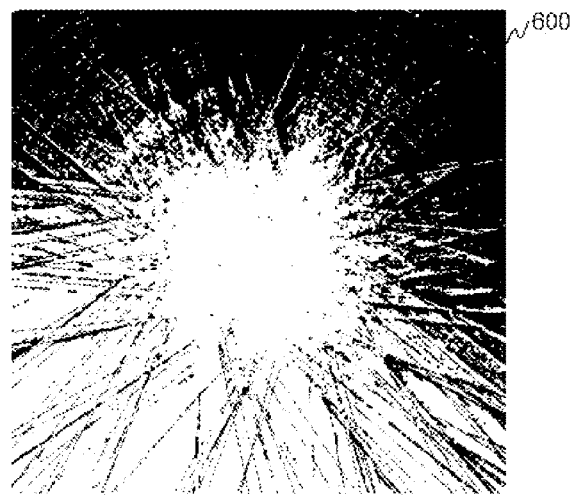

[FIG. 6E]
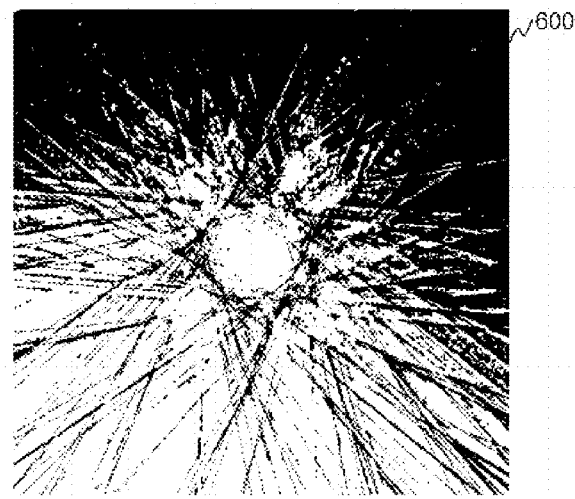
[FIG. 6F]
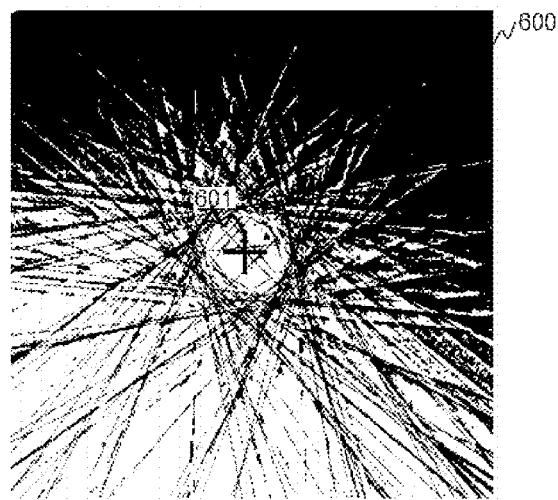

[FIG. 7]
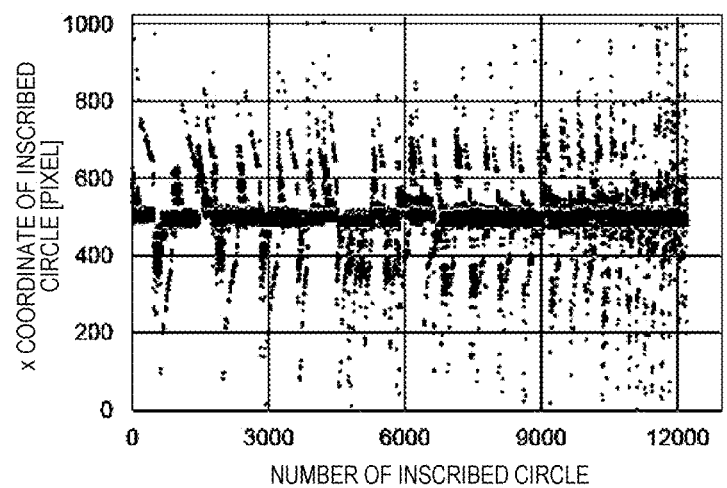

[FIG. 8]
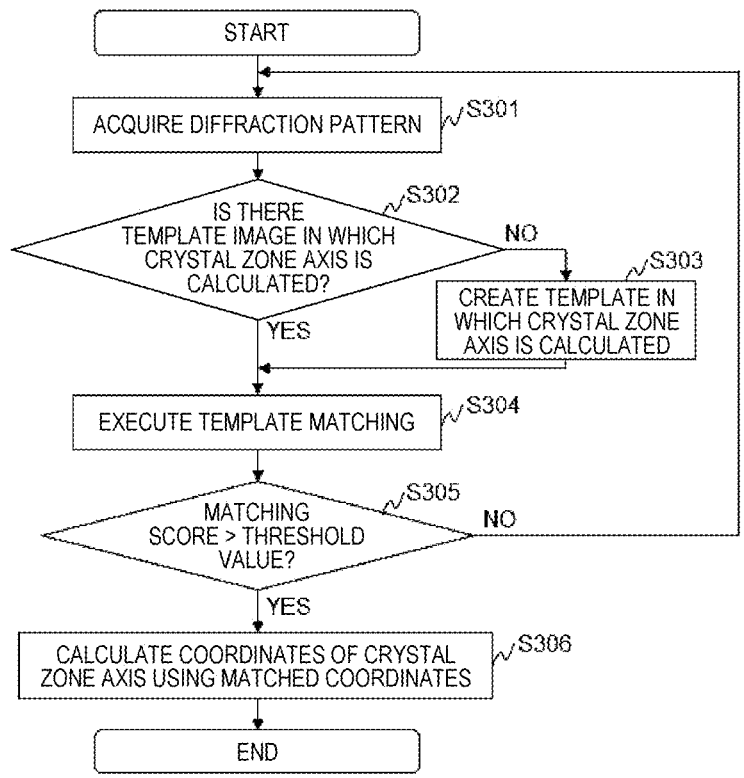

[FIG. 9A]
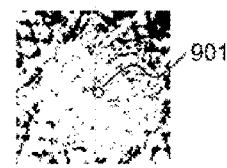
[FIG. 9B]
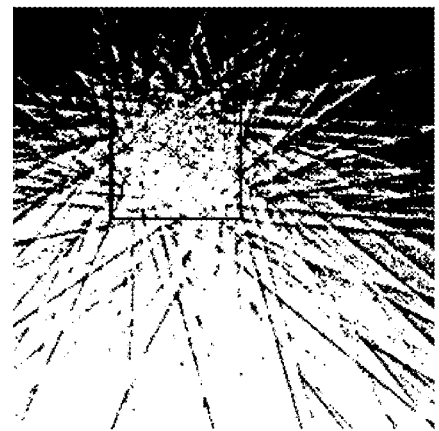

[FIG. 10]
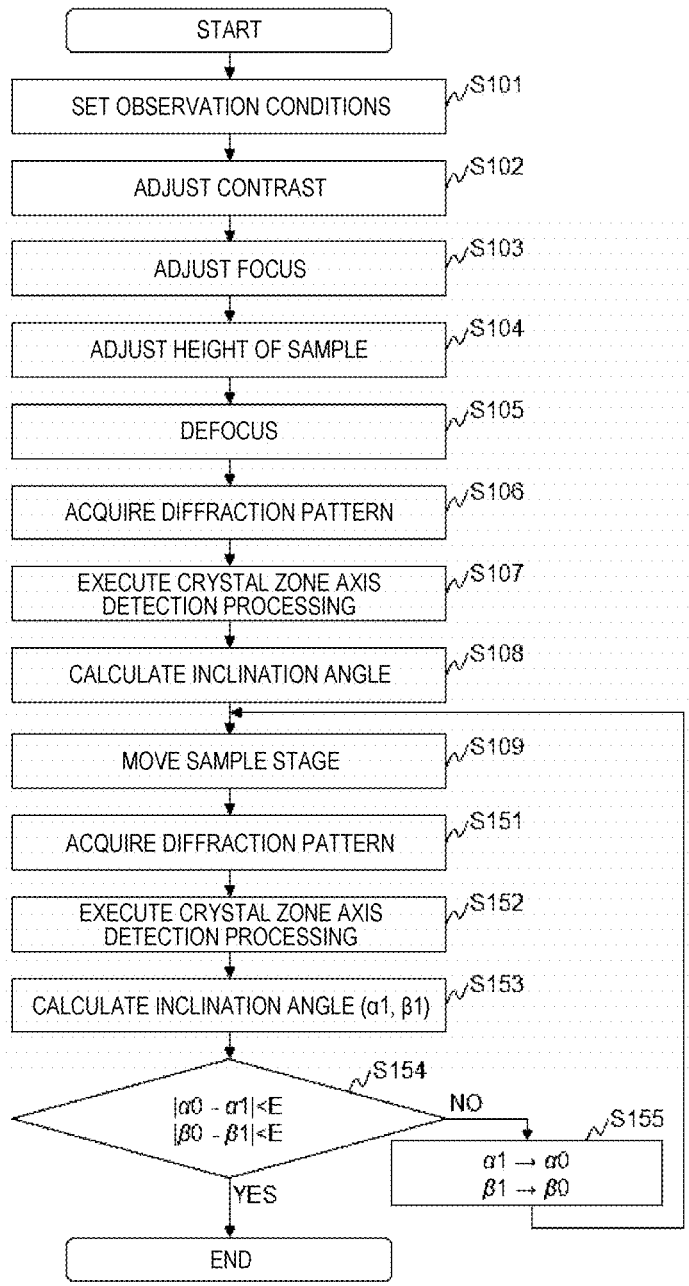

[FIG. 11]
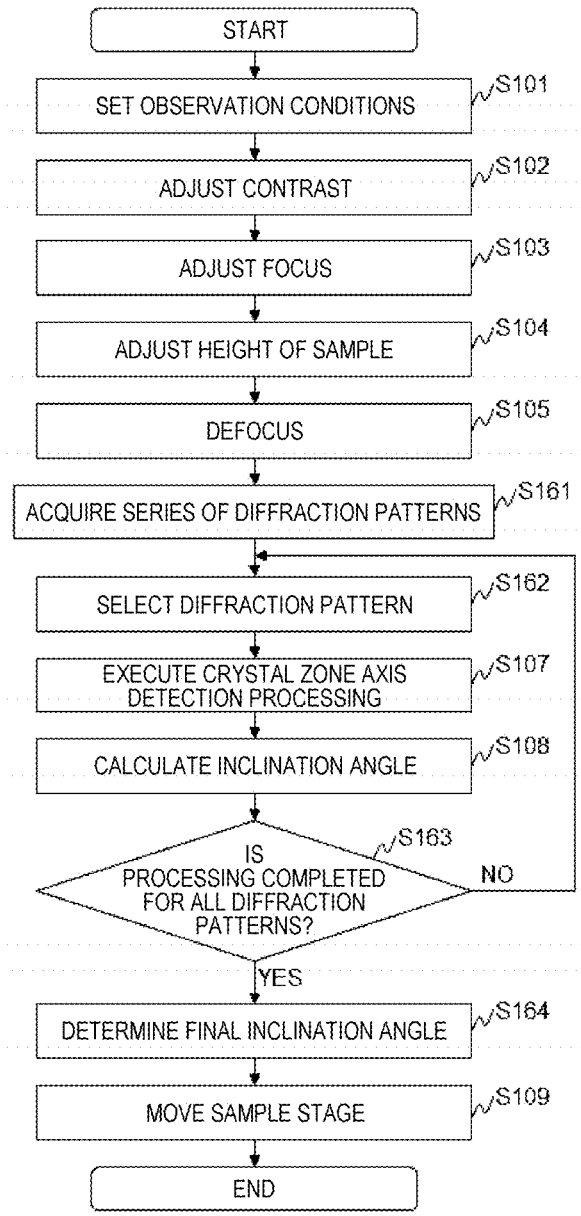

[FIG. 12]
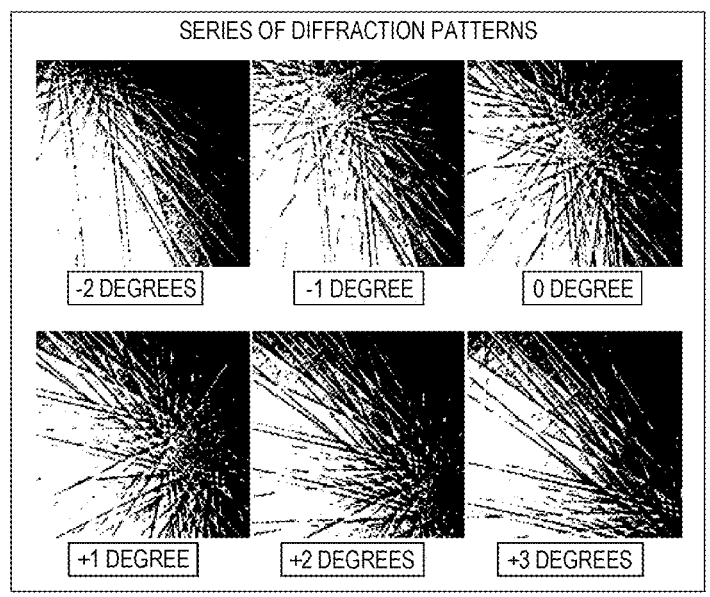
[FIG. 13]
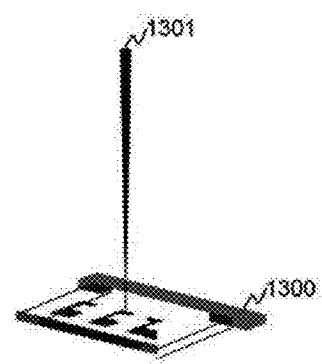

[FIG. 14A]
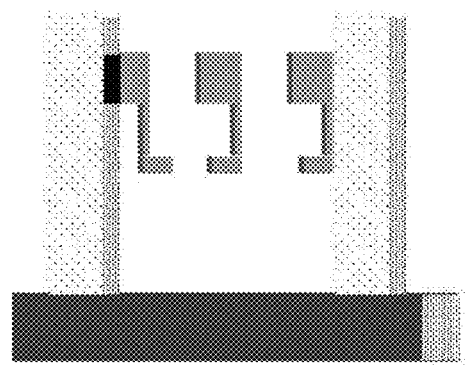
[FIG. 14B]
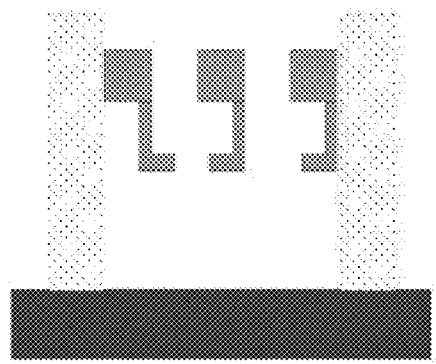

CHARGED PARTICLE BEAM APPARATUS AND METHOD OF CONTROLLING CHARGED PARTICLE BEAM APPARATUS

TECHNICAL FIELD

The present invention relates to a charged particle beam apparatus and a method of controlling the charged particle beam apparatus.

BACKGROUND ART

In observing a sample using a charged particle beam apparatus such as STEM and TEM, resolution of an obtained image changes depending on a crystal orientation of the sample irradiated with an electron beam. By arranging a sample structure in a traveling direction of an electron beam for irradiation, a high-resolution image with prevented image bleeding can be obtained. The crystal orientation of the sample may be known from an external appearance of the sample, but in a case of a sample prepared by a focused ion beam apparatus or the like, the external appearance and an internal crystal direction are different from each other and cannot be known from the external appearance. When the crystal orientation of the sample cannot be determined from the external appearance, it is necessary to calculate an amount of deviation and a direction of the crystal orientation of the sample by using a diffraction pattern obtained by irradiation of the electron beam.

As a method of calculating a crystal orientation of a sample, methods using a diffraction pattern as described in PTL 1, PTL 2, and PTL 3 are known.

PTL 1 describes a method of calculating a crystal orientation of a sample by using a diffraction spot included in the diffraction pattern. Specifically, there is disclosed an observation method of "setting a fitting circular pattern (26) displayed overlaid so that a main spot (23) is positioned on a circumference thereof, on the basis of a diffraction spot brightness distribution in an electron beam diffraction pattern (22b) displayed in a display unit (13); setting a vector (28) displayed with a start point at a center position (27) of the displayed circular pattern (26), and an end point at a location of the main spot (23) positioned on the circumference of the circular pattern (26); and performing the crystal orientation based on an orientation and a magnitude of the displayed vector (28)".

PTL 2 discloses a method of specifying a crystal orientation of a sample by comparing a simulation pattern of a plurality of inclination angles with a current diffraction pattern.

PTL 3 discloses "an inclination angle amount calculating device, which is a device for use in the charged particle beam apparatus for making a charged particle beam irradiated to a surface of a sample mounted on a sample stage, the device being configured to calculate inclination angle amounts, the inclination angle amounts being command values to control an inclination direction and an inclination amount of the sample and/or the charged particle beam, the command values being necessary to change an incident direction of the charged particle beam with respect to the sample, the inclination angle amount calculating device including an inclination angle amount calculating unit for calculating the inclination angle amounts based on information that indicates the incident direction of the charged particle beam with respect to a crystal lying at a selected position on the surface in a state where the incident direction of the charged particle beam with respect to the sample is in a predetermined incident direction, the information being designated on a crystal orientation figure, which is a diagram showing the incident direction of the charged particle beam with respect to a crystal coordinate system of the crystal".

In order to acquire the diffraction pattern including the diffraction spots, it is necessary to reduce an irradiation angle (also referred to as an aperture angle) of a primary electron beam with which the sample is irradiated to approximately several mrad. This is because if the primary electron beam for irradiation is widened, the diffraction spot when acquired by a detector is also widened, and it becomes difficult to separate spot positions since the spot overlaps with the adjacent spot.

When a method of implementing a thin primary electron beam by using an irradiation aperture having a hole diameter of several micrometers is adopted, contamination due to electron beam irradiation is likely to be attached to the irradiation aperture, and a frequency of replacement of the irradiation aperture increases. In a case where a method of implementing a thin primary electron beam by adjusting an intensity of an irradiation lens that controls the primary electron beam is adopted, an excitation condition changes when the intensity of the irradiation lens is changed. Therefore, it is necessary to readjust an axis adjustment of an electron microscope. In addition, when the crystal orientation of the sample is adjusted under a condition different from an observation condition, there is a possibility that an accurate crystal orientation of the sample cannot be calculated.

When the method described in PTL 2 is used, it is necessary to prepare an image by performing simulation in advance. However, the simulation cannot be performed on a sample having an unknown structure or the like. In addition, in order to use the method described in PTL 2, it is necessary to prepare an enormous number of simulation images, and applicable conditions are limited to a part.

In the case of using the method described in PTL 3, it is necessary for a user to specify an incident direction of the charged particle beam with respect to the crystal on the crystal orientation figure in advance. When a sample having a fine structure is observed, there is a possibility that a highly accurate image cannot be obtained by designation by the user.

PTL 3 describes that the crystal orientation can be calculated from the diffraction pattern including a Kikuchi line, but does not disclose a specific calculation method.

CITATION LIST

Patent Literature

PTL 1: WO 2016/006375
PTL 2: US Patent No. 9978557 specification
PTL 3: WO 2018/221636

SUMMARY OF INVENTION

Technical Problem

The invention provides a charged particle beam apparatus that automatically adjusts a crystal orientation of a sample without limiting an electron beam.

Solution to Problem

A representative example of the invention disclosed in the present application is as follows. That is, a charged particle beam apparatus that irradiates a sample with a charged particle beam to observe the sample, the charged particle beam apparatus includes: a movement mechanism configured to hold and move a sample; a particle source configured to output the charged particle beam; an optical element configured to adjust an irradiation direction and a focal of the charged particle beam on the sample; a detector configured to detect a signal emitted from the sample irradiated with the charged particle beam; and a control mechanism configured to control the moving mechanism, the particle source, the optical element, and the detector based on observation conditions, in which the control mechanism is configured to acquire a diffraction pattern including a plurality of Kikuchi lines, calculate a crystal zone axis of the sample by performing analysis based on a plurality of intersections at which two Kikuchi lines included in the diffraction pattern intersect with each other, calculate an inclination angle, which is an angle at which the sample is inclined, based on the crystal zone axis and an irradiation direction of the charged particle beam, and control the moving mechanism based on the inclination angle.

Advantageous Effect

According to one aspect of the invention, it is possible to provide a charged particle beam apparatus capable of automatically adjusting a crystal orientation of a sample. Problems, configurations, and effects other than those described above will be further clarified with the following description of embodiments.

BRIEF DESCRIPTION OF DRAWINGS

FIG. 1 is a diagram showing an example of a configuration of a transmission electron microscope (TEM) according to a first embodiment.

FIG. 2 is a flowchart showing a sample stage adjustment processing executed by the TEM according to the first embodiment.

FIG. 3A is a diagram showing an example of a diffraction pattern acquired by the TEM according to the first embodiment.

FIG. 3B is a diagram showing an example of the diffraction pattern including a crystal zone axis detected by a processing by the TEM according to the first embodiment.

FIG. 3C is a diagram showing an example of the diffraction pattern that describes a method of calculating an inclination angle executed by the TEM according to the first embodiment.

FIG. 4A is a diagram showing an example of the diffraction pattern acquired by the TEM according to the first embodiment.

FIG. 4B is a diagram showing an example of the diffraction pattern acquired by the TEM according to the first embodiment.

FIG. 5 is a flowchart showing an example of a crystal zone axis detection processing according to the first embodiment.

FIG. 6A is a diagram showing a diffraction pattern showing a specific example of the crystal zone axis detection processing according to the first embodiment.

FIG. 6B is a diagram showing a diffraction pattern showing a specific example of the crystal zone axis detection processing according to the first embodiment.

FIG. 6C is a diagram showing a diffraction pattern showing a specific example of the crystal zone axis detection processing according to the first embodiment.

FIG. 6D is a diagram showing a diffraction pattern showing a specific example of the crystal zone axis detection processing according to the first embodiment.

FIG. 6E is a diagram showing a diffraction pattern showing a specific example of the crystal zone axis detection processing according to the first embodiment.

FIG. 6F is a diagram showing a diffraction pattern showing a specific example of the crystal zone axis detection processing according to the first embodiment.

FIG. 7 is a graph showing a distribution of centers of inscribed circles used in the crystal zone axis detection processing according to the first embodiment.

FIG. 8 is a flowchart showing an example of another crystal zone axis detection processing according to the first embodiment.

FIG. 9A is a diagram showing a diffraction pattern that describes template matching according to the first embodiment.

FIG. 9B is a diagram showing a diffraction pattern that describes the template matching according to the first embodiment.

FIG. 10 is a flowchart showing a sample stage adjustment processing executed by a TEM according to a second embodiment.

FIG. 11 is a flowchart showing a sample stage adjustment processing executed by a TEM according to a third embodiment.

FIG. 12 is a diagram showing an example of a series of diffraction patterns acquired by the TEM according to the third embodiment.

FIG. 13 is a diagram showing a relationship between a primary beam and a semiconductor device observed by an electron microscope according to a fourth embodiment.

FIG. 14A is a diagram showing an example of an image when the semiconductor device is observed using the electron microscope according to the fourth embodiment.

FIG. 14B is a diagram showing an example of the image when the semiconductor device is observed using the electron microscope according to the fourth embodiment.

DESCRIPTION OF EMBODIMENTS

Embodiments of the invention will be described below with reference to drawings. However, the invention should not be construed as being limited to the description of the embodiment described below. Those skilled in the art could have easily understood that specific configurations can be changed without departing from the spirit or scope of the invention.

In configurations of the invention described below, the same or similar configurations or functions are denoted by same reference numerals, and a repeated description thereof is omitted.

In the present specification, expressions such as "first", "second", and "third" are used to identify components, and do not necessarily limit the number or order.

The positions, sizes, shapes, ranges, and the like of the respective components illustrated in the drawings may not represent actual positions, sizes, shapes, ranges, and the like in order to facilitate understanding of the inventions. Therefore, the present disclosure is not limited to the positions, sizes, shapes, ranges, and the like disclosed in the drawings.

First Embodiment

FIG. 1 is a diagram showing an example of a configuration of a transmission electron microscope (TEM) according to a first embodiment.

A TEM 100 includes an electron optical lens chamber 101 and a control unit 102.

The electron optical lens chamber 101 includes an electron source 111, first and second condenser lenses 112, a condenser aperture 113, an axis deviation correction deflector 114, a stigmator 115, an image shift deflector 116, an objective lens 117, a sample stage 118, an intermediate lens 119, a projection lens 120, and a CCD camera 121. When the above devices included in the electron optical lens chamber 101 are not distinguished from each other, the devices are also referred to as target devices.

The sample stage 118 holds a sample 122. The sample 122 may be held by a sample holder fixed to the sample stage 118. The sample stage 118, the sample holder, or a combination thereof is an example of a movement mechanism that realizes holding and movement of the sample 122.

The sample stage 118 can be inclined on one or a plurality of inclination axes (rotation axes).

An electron beam emitted from the electron source 111 which is a particle source is reduced by the first and second condenser lenses 112, and an emission angle is limited by the condenser aperture 113. Further, the electron beam is emitted in a direction parallel to the sample 122 by a magnetic field in front of the objective lens 117 after an axis adjustment is performed by the axis deviation correction deflector 114, the stigmator 115, and the image shift deflector 116.

The first and second condenser lenses 112, the condenser aperture 113, the axis deviation correction deflector 114, the stigmator 115, the image shift deflector 116, the objective lens 117, the sample stage 118, the intermediate lens 119, and the projection lens 120 are examples of optical elements that adjust a direction and a focal of the electron beam with respect to the sample 122.

Normally, in the TEM 100, a diffraction pattern is formed on a focal plane on a rear side positioned between the objective lens 117 and the intermediate lens 119 due to an influence of a rear magnetic field of the objective lens 117. The diffraction pattern is enlarged by the intermediate lens 119 and the projection lens 120, and is detected by the CCD camera 121.

The CCD camera 121 is an example of a detector that detects a signal emitted from the sample 122 irradiated with the electron beam.

A computer, which is the control unit 102, controls the electron optics lens chamber 101 by using a plurality of control circuits. The control unit 102 includes an electron gun control circuit 151, an irradiation lens control circuit 152, a condenser aperture control circuit 153, an axis deviation correction deflector control circuit 154, a stigmator control circuit 155, an image shift deflector control circuit 156, an objective lens control circuit 157, a sample stage control circuit 158, an intermediate lens control circuit 159, a projection lens control circuit 160, and a CCD camera control circuit 161.

The control unit 102 acquires a value of each target device via each control circuit and inputs a value to each target device via each control circuit to create an optional electron optical condition. The control unit 102 is an example of a control mechanism that realizes control of the electron optical lens chamber 101.

The control unit 102 includes a processor 171, a main storage device 172, an auxiliary storage device 173, an input device 174, an output device 175, and a network interface 176. The devices are connected to each other via a system bus.

The processor 171 executes a program stored in the main storage device 172. The processor 171 functions as various functional units by executing processing in accordance with the program.

The main storage device 172 is a storage device such as a semiconductor memory, and stores the program to be executed by the processor 171 and data. The main storage device 172 is also used as a work area temporarily used by the program. The main storage device 172 stores, for example, an operating system, a program for controlling the target device of the TEM 100, a program for acquiring an image of the sample 122, a program for processing an acquired image, or the like.

In the present specification, when the processing is described mainly by the TEM 100 (control unit 102), it means that the processor 171 that executes any one of the programs executes the processing.

The auxiliary storage device 173 is a storage device such as a hard disk drive (HDD) or a solid state drive (SSD), and permanently stores data. The program and the data stored in the main storage device 172 may be stored in the auxiliary storage device 173. In this case, the processor 171 reads the program and the data from the auxiliary storage device 173 and loads the program and the data into the main storage device 172 when the control unit 102 is activated or the processing is necessary.

The input device 174 is a device such as a keyboard, a mouse, and a touch panel for a user to input instructions and information to the control unit 102. The output device 175 is a device such as a display and a printer for outputting an image, an analysis result, or the like to the user. The network interface 176 is an interface for communicating via a network.

In FIG. 1, the control unit 102 is described as one computer, and the control unit 102 may be configured by using a plurality of computers. A function of the control unit 102 may be implemented by using a logic circuit.

The configuration and processing described in the first embodiment can be applied to a charged particle beam apparatus other than the TEM 100. For example, the configuration and processing can be applied to a scanning transmission electron microscopy (STEM), a scanning electron microscopy (SEM) for detecting secondary electrons and reflected electrons, and a device using charged particles different from electrons.

In the STEM, unlike the TEM 100, the sample 122 is irradiated with a focused electron beam, and the scanning is performed with an electron beam focused by using a deflection coil such as the image shift deflector 116. Using a transmission electron detector different from the CCD camera 121, a signal is recorded by the detector at each scanning position on the sample, and the control unit 102 displays an image.

FIG. 2 is a flowchart showing a sample stage adjustment processing executed by the TEM 100 according to the first embodiment. FIG. 3A is a diagram showing an example of a diffraction pattern acquired by the TEM 100 according to the first embodiment. FIG. 3B is a diagram showing an example of the diffraction pattern including a crystal zone axis detected by the processing using the TEM 100 of the first embodiment. FIG. 3C is a diagram showing an example of the diffraction pattern that describes a method of calculating an inclination angle executed by the TEM 100 of the first embodiment. FIGS. 4A and 4B are diagrams showing an example of a diffraction pattern acquired by the TEM 100 of the first embodiment.

In FIG. 2, a processing for automatically adjusting the sample stage 118 such that the TEM 100 has an optimum inclination angle of the sample 122 on one inclination axis will be described. When the inclination angle of the sample 122 is adjusted with respect to the plurality of inclination axes, the processing described with reference to FIG. 2 is executed with respect to each inclination axis. It is assumed that the sample 122 is present near a center of a field of view at a start of the processing.

The control unit 102 sets observation conditions such as an acceleration voltage and an irradiation current in the electron optics lens chamber 101 (step S101).

Next, the control unit 102 adjusts a contrast and a focus such that an image of the sample 122 is clear (steps S102 and S103).

Specifically, the control unit 102 adjusts a value of an objective lens current flowing through the objective lens 117 such that the image of the sample 122 is clear by transmitting the signal to the objective lens control circuit 157. By adjusting the focus, the value of the objective lens current flowing through the objective lens 117 changes from an objective lens current value IA (reference objective lens current value IA) as a reference set in the electron optical lens chamber 101.

Next, the control unit 102 adjusts a height of the sample 122 (step S104).

Specifically, the control unit 102 obtains a height at which the image of the sample 122 is clear at the reference objective lens current value IA based on a difference between an objective lens current value IB and the reference objective lens current value IA. For example, when a sample height H0 before adjustment and a sample height H1 after adjustment are assumed, the sample height H1 after adjustment is obtained from Equation (1). Here, A is a coefficient calculated from a relationship between the objective lens current value and the sample height in focus, and a unit is "um/A".

$$H1=(IA-IB) \times A+H0 \quad \text{[Equation 1]}$$

By using the Equation (1), the sample height H1 can be calculated based on the difference between the objective lens current value IB after focus adjustment and the reference objective lens current value IA.

The control unit 102 adjusts the sample height of the sample stage 118 based on the sample height H1 via the sample stage control circuit 158. By adjusting the sample height, a clear image of the sample 122 can be observed with the reference objective lens current value IA of the TEM 100.

Next, the control unit 102 performs defocusing by adjusting the objective lens current value (step S105). The defocusing is an operation for acquiring an image (diffraction pattern) including a Kikuchi line. An amount of defocus adjustment varies depending on conditions of the electron optical lens chamber 101 and an irradiation system. For example, an appropriate amount of the defocus adjustment that makes it easy to clearly observe the Kikuchi line is about 5 um to 50 um, but the present patent can be applied even when the amount is 50 um or more.

Specifically, the control unit 102 adjusts the objective lens current value from the reference objective lens current value IA by the amount of the defocus adjustment using the coefficient A. The adjusted objective lens current amount IC is obtained from Equation (2). Here, D represents a defocus amount.

$$IC=D \times A+IA \quad \text{[Equation 2]}$$

In general, there are two cases of the defocusing, one having an intersection of electron beams on an electron gun side of the sample 122 and the other having an intersection on a lower side of the sample 122, but a defocusing method may be either.

In the first embodiment, the crystal zone axis is calculated using the diffraction pattern including the Kikuchi line caused by multiple scattering, and the inclination angle of the sample 122 is calculated.

There are various optical systems of the TEM 100 for recording the Kikuchi line, and for example, the diffraction pattern obtained by irradiating the sample with an electron beam having a large aperture angle (for example, about several hundred mrad) is used. Even when the aperture angle of a primary beam with respect to the sample 122 is about 20 mrad, the same diffraction pattern may be acquired by adjusting parameters of an image processing. Although the above aperture angle is assumed under an acceleration voltage of about 200 kV, when the acceleration voltage is low, a scattering angle changes according to a wavelength of the primary beam, and thus the aperture angle of the primary beam required to obtain a similar diffraction pattern is smaller.

For example, as a guideline for the required aperture angle, a parameter obtained by dividing an aperture angle θ by a wavelength λ may be adjusted to be constant. The guideline is obtained by approximating the Bragg's law, and more precisely, is a parameter obtained by dividing sine by the wavelength λ. In a case of using as the parameter, a result is the same even when a reciprocal (wavelength λ is divided by the aperture angle θ) is used.

For example, in the case of 200 mrad at the acceleration voltage of 200 kV, and the wavelength is 2.5 pm, the aperture angle is 384 mrad at 60 kV (wavelength 4.8 pm) such that 200/2.5 [mrad/pm]=80 [mrad/pm] is constant. Similarly, when the aperture angle of the primary beam of 200 kV with which the sample is irradiated is 30 mrad, the aperture angle is 57.6 mrad.

Next, the control unit 102 acquires the diffraction pattern including the Kikuchi line (step S106).

Specifically, the control unit 102 acquires the diffraction pattern by transmitting a recording signal to the CCD camera 121 via the CCD camera control circuit 161. For example, a diffraction pattern 300 as shown in FIG. 3A is acquired. A straight line 301 included in the diffraction pattern 300 is the Kikuchi line. As described above, the diffraction pattern 300 includes a plurality of Kikuchi lines.

When acquiring the diffraction pattern, the TEM 100 may emit an electron beam fixed at a specific position of the sample 122, or emit the electron beam so as to scan a partial region of the sample 122 by controlling the image shift deflector 116 or the like. By emitting the electron beam so as to scan the partial region of the sample 122, an effect of making the contrast and the like of the diffraction pattern 300 clear can be expected. FIG. 4A shows an example of a diffraction pattern in a case where the primary beam is stopped on the sample without scanning, and FIG. 4B shows an example of a diffraction pattern in a case where a minute region is scanned. A scanning range of the minute region is smaller than that of a semiconductor device sample, and in addition, is a range in which an irradiation angle of the primary beam is smaller than a detection accuracy of the crystal zone axis to be calculated. By acquiring the diffraction pattern while performing the scanning, it is possible to reduce streaky intensity unevenness such as intensity unevenness 401 derived from a surface.

Next, the control unit 102 executes a crystal zone axis detection processing for detecting the crystal zone axis from the diffraction pattern (step S107). Details of the crystal zone axis detection processing will be described with reference to FIG. 5.

The crystal zone axis is an axis that faces a direction of a line of intersection of two planes that are not parallel to each other in a crystal. In the TEM 100, in order to observe the transmitted image of the sample 122, by observing the sample 122 along the crystal zone axis, it is possible to observe a high-resolution image of the sample 122 in which atomic structures are arranged in the direction of the electron beam and there is no bleeding. The crystal zone axis described here is a crystal zone axis having a low order, and is generally an axis aligned with the direction of the primary beam in TEM observation.

By executing the crystal zone axis detection processing, a crystal zone axis 302 as shown in FIG. 3B is detected from the diffraction pattern 300 shown in FIG. 3A.

In general, a person can specify the approximate crystal zone axis 302 by referring to the diffraction pattern 300. However, the computer (control unit 102) cannot specify the crystal zone axis 302 from the diffraction pattern 300 directly. The first embodiment is characterized in that the control unit 102 calculates the crystal zone axis 302 by executing the crystal zone axis detection processing on the diffraction pattern.

Next, the control unit 102 calculates the inclination angle of the sample 122 based on the detected crystal zone axis (step S108). Specifically, the following processing is executed.

The control unit 102 calculates a center of the primary beam serving as a current center of the objective lens 107. The current center of the objective lens 107 can be calculated from a position where the electron beam is focused on the detector (CCD camera 121) when a current value of the objective lens 107 is changed. Since a method of determining the current center is a known technique, a detailed description thereof will be omitted.

The control unit 102 calculates the inclination angle θ of the sample 122 from Equation (3) defined by an optical camera length L from the sample 122 to the CCD camera 121 and a distance D between the crystal zone axis 302 and the center of the primary beam.

$$\theta = \arctan\left(\frac{D}{L}\right) \qquad \text{[Equation 3]}$$

When coordinates of the crystal zone axis 302 as shown in FIG. 3C are (x0, y0) and coordinates of a center 303 of the primary beam are (x1, y1), the distance D is given by Equation (4).

$$D = \sqrt{(x0-x1)^2 + (y0-y1)^2} \qquad \text{[Equation 4]}$$

Equations (3) and (4) may be simply converted into approximate expressions assuming that θ is small and used. The above is a description of the processing of step S108.

When only one inclination axis is adjusted, the diffraction pattern shifts and moves only in one direction. Therefore, the center of the primary beam may not coincide with the crystal zone axis. In this case, the control unit 102 calculates an inclination angle at which the center of the primary beam and the crystal zone axis are closest to each other.

Next, the control unit 102 moves the sample stage 118 based on the inclination angle θ (step S109), and then ends the sample stage adjustment processing.

Specifically, the control unit 102 moves the sample stage 118 by transmitting the signal to the sample stage control circuit 158 based on the inclination angle θ. The movement of the sample stage 118 includes an inclination movement, a shift movement, a rotational movement, and the like.

After the end of the processing, the control unit 102 executes a processing such as observation of the sample 122. When the sample 122 is observed, the observation conditions can be used without being changed.

FIG. 5 is a flowchart showing an example of the crystal zone axis detection processing according to the first embodiment. FIGS. 6A, 6B, 6C, 6D, 6E, and 6F are diffraction patterns showing specific examples of the crystal zone axis detection processing according to the first embodiment. FIG. 7 is a graph showing a distribution of centers of inscribed circles used in the crystal zone axis detection processing according to the first embodiment.

The control unit 102 binarizes a diffraction pattern 600 acquired in step S106 (step S201).

For example, the control unit 102 generates a diffraction pattern 610 by binarizing the diffraction pattern 600 using a Canny filter. In the binarized diffraction pattern 610, the plurality of Kikuchi lines appears as white straight lines. The invention is not limited to a binarization method, and the binarized diffraction pattern 610 may be generated using a filter other than the Canny filter or another method.

Next, the control unit 102 detects the Kikuchi line using the diffraction pattern 610 (step S202).

For example, the control unit 102 detects information on the straight line (Kikuchi line) by performing Hough transform on the diffraction pattern 610. Several hundreds of Kikuchi lines are detected depending on Hough transform parameters. As the information on the straight line, a set of an inclination and an intercept, a polar coordinate, a set of a start point and an endpoint, and the like can be considered. The invention is not limited to a method of detecting a straight line.

647 Kikuchi lines are detected from the diffraction pattern 610.

Next, the control unit 102 selects the Kikuchi line to be used for processing from the detected Kikuchi lines (step S203).

When the processing described later is executed using all the Kikuchi lines detected in step S202, an amount of calculation increases and processing time increases. In order to avoid the above problem, the control unit 102 selects a Kikuchi line.

In the Hough transform, a plurality of straight lines having similar information are often detected. Therefore, the control unit 102 aggregates similar Kikuchi lines into one Kikuchi line based on the set of the inclination and the intercept. When the information on the straight line is the polar coordinate or the set of the start point and the end point, the control unit 102 calculates the set of the inclination and the intercept from an equation of the straight line, and then executes the above processing.

As a result of the processing for the diffraction pattern 600, 77 Kikuchi lines as shown in FIG. 6C are selected. In FIG. 6C, the selected Kikuchi lines are highlighted.

When the Hough transform parameters are adjusted to limit the detected Kikuchi line in advance, the processing of step S203 may not be executed.

Next, the control unit 102 calculates an inscribed circle using the Kikuchi lines (step S204).

The control unit 102 selects three Kikuchi lines, and calculates a center (inner center) and a radius of an inscribed circle of a triangle having an intersection of the Kikuchi lines as a vertex.

As a result of the processing for the diffraction pattern 600, the number of combinations of the three Kikuchi lines is 77×76×75/6=73150. The center (inner center) of the inscribed circle and the radius of the inscribed circle with respect to the 73150 combination of the three Kikuchi lines are calculated.

FIG. 6D shows the diffraction pattern 600 in which the centers of the inscribed circles are plotted. FIG. 6D is a diagram showing a plot result, and the Kikuchi line does not disappear. As shown in FIG. 6D, it can be seen that the centers of the inscribed circles are concentrated near the center of the diffraction pattern 600 (image) in which the crystal zone axis is predicted to be present.

Next, the control unit 102 selects an inscribed circle to be used for processing from the calculated inscribed circles (step S205).

As shown in FIG. 6D, the centers of the calculated inscribed circles are distributed with a spread. Therefore, the control unit 102 selects the inscribed circle related to the crystal zone axis based on the center and the radius of the inscribed circle. For example, the control unit 102 selects an inscribed circle in which a distance between the center of the inscribed circle and a mode value of the center of the inscribed circle is smaller than a first threshold value and the radius of the inscribed circle is smaller than a second threshold value.

It is assumed that a threshold value of the radius used when the inscribed circle is selected is set in advance. The threshold value can be updated as appropriate.

In the diffraction pattern 600 shown in FIG. 6, since the radius of the inscribed circle related to the crystal zone axis is about 80 pixels, the control unit 102 performs the processing to select the inscribed circle having a radius of about 80 pixels. As a result, the number of the inscribed circles is reduced from approximately 70,000 to approximately 12,000, which is approximately ⅐.

FIG. 6E shows the diffraction pattern 600 obtained by plotting the centers of the selected inscribed circles. When FIGS. 6D and 6E are compared with each other, it can be seen that the number of the inscribed circles is sufficiently small.

Next, the control unit 102 calculates the coordinates of the crystal zone axis using the selected inscribed circles (step S206). For example, the following calculation method is conceivable.

(Calculation Method 1) The control unit 102 calculates an average value of the coordinates of the centers of the selected inscribed circles as the coordinates of the crystal zone axis.

(Calculation method 2) As a method of increasing accuracy of the coordinates, a fitting method in consideration of an outlier of the distribution of the centers of the inscribed circles is conceivable.

FIG. 7 is a graph showing the distribution of the centers of the inscribed circles. A vertical axis represents an x axis of the inscribed circle, and a horizontal axis represents an identification number of the inscribed circle. As shown in FIG. 6E, since the centers of the inscribed circles are concentrated in the vicinity of the center of the diffraction pattern 600, the centers of the inscribed circles are concentrated in the vicinity of 600 pixels which is a midpoint of the x axis. The centers of the inscribed circles in the vicinity of 0 pixels and in the vicinity of 1000 pixels are inscribed circles that are not related to the crystal zone axis.

As a method of accurately finding the mode value for a data group including the outlier as described above, the fitting method such as RANdom sample consensus (RANSAC) is known.

Although the distribution of the centers of the inscribed circles on the x axis is shown in FIG. 7, the same fitting method can also be used for the distribution of the centers of the inscribed circles on the y axis.

As a result of the processing for the diffraction pattern 600, a crystal zone axis 601 as shown in FIG. 6F is detected.

According to the first embodiment, the control unit 102 can calculate the crystal zone axis with high accuracy by performing analysis using the diffraction pattern including the Kikuchi line. In the first embodiment, the user does not need to refer to the diffraction pattern, and a crystal structure or the like of the sample may be unknown in advance. In addition, the control unit 102 can calculate the inclination angle of the sample 122 based on the crystal zone axis. Therefore, it is possible to realize an electron microscope that can automatically adjust a crystal orientation of the sample with high accuracy.

(First Modification)

The control unit 102 calculates the crystal zone axis based on the inscribed circle of the triangle formed by the intersection of the three Kikuchi lines, and the crystal zone axis can also be calculated by the following method.

In step S204, the control unit 102 generates a set of two Kikuchi lines and calculates the intersection of the two Kikuchi lines.

In step S205, the control unit 102 selects the intersection to be used for processing. For example, the control unit 102 excludes intersections that do not belong to any cluster by using a method such as clustering.

In step S206, the control unit 102 calculates the coordinates of the crystal zone axis using the distances from each intersection as an index. For example, the control unit 102 calculates the coordinates of the crystal zone axis based on an algorithm of a least-squares method such that a total value of the distances from each intersection is minimized.

(Second Modification)

A method of detecting the crystal zone axis is also conceivable other than the method shown by the flowchart of FIG. 5. For example, there is a method using template matching.

FIG. 8 is a flowchart showing an example of another crystal zone axis detection processing according to the first embodiment. FIGS. 9A and 9B are diagrams showing the diffraction patterns for describing the template matching according to the first embodiment.

In a case of the template matching, it is necessary to identify a position of the crystal zone axis in advance. For example, a reference image near the identified crystal zone axis as shown in FIG. 9A is prepared, and a crystal zone axis position 901 is calculated. FIG. 9B shows an example in which the template matching is performed using the image of FIG. 9A.

The control unit 102 acquires the diffraction pattern (step S301). Next, the control unit 102 determines whether there is a template image in which the crystal zone axis is calculated (step S302).

When there is the template image, the control unit 102 proceeds to step S304. When there is no template image, the control unit 102 generates the template image in which the crystal zone axis is calculated (step S303), and then proceeds to step S304.

In step S304, the control unit 102 executes the template matching using the template image (step S304).

In order to confirm that a matching result is reliable, the control unit 102 determines whether a matching score is larger than a threshold value (step S305).

When the matching score is equal to or less than the threshold value, the control unit 102 returns to step S301 and executes the same processing.

When the matching score is larger than the threshold value, the control unit 102 calculates the coordinates of the crystal zone axis in the diffraction pattern acquired in step S301 using the matched coordinates and the coordinates of the crystal zone axis in a template (step S306).

Although FIG. 8 shows an example in which the template matching is used, a method of using a feature amount using an image processing function such as AKAZE for matching between images is also conceivable.

Second Embodiment

In an adjustment of the sample stage 118, the crystal orientation of the sample after the sample stage 118 is moved based on the inclination angle of the sample 122 may not be correctly adjusted to a desired angle due to adjustment accuracy of the sample stage 118 and an error or a mistake in the result of the crystal zone axis detection processing. That is, there is a case where the crystal zone axis and the center of the primary beam do not coincide with each other.

In a second embodiment, the sample stage 118 is moved in consideration of the above problem. Hereinafter, the second embodiment will be described focusing on differences from the first embodiment.

A configuration of the TEM 100 according to the second embodiment is the same as that of the first embodiment. In the second embodiment, the sample stage adjustment processing is different.

FIG. 10 is a flowchart showing a sample stage adjustment processing executed by the TEM 100 according to the second embodiment.

The processings from step S101 to step S109 are the same as the processings of the first embodiment. In the second embodiment, it is assumed that inclination angles $\alpha 0$ and $\beta 0$ of the sample 122 at the two inclination axes are calculated. The number of the inclination axes to be adjusted may be one, or may be three or more.

In the following description, the inclination angles $\alpha 0$ and $\beta 0$ used for moving the sample stage 118 are also referred to as the target inclination angles $\alpha 0$ and $\beta 0$.

After moving the sample stage 118, the control unit 102 acquires a diffraction pattern including Kikuchi lines (step S151), and executes the crystal zone axis detection processing (step S152). The processings of steps S151 and S152 are the same as the processings of steps S106 and S107, and the processings of steps S103 to S105 may be performed when a change in the sample height is large and the Kikuchi line cannot be clearly observed.

Next, the control unit 102 calculates inclination angles $\alpha 1$ and $\beta 1$ after the movement (step S153). The processing of step S153 is the same as the processing of step S108.

In the following description, the inclination angles $\alpha 1$ and $\beta 1$ calculated after the movement of the sample stage 118 are also referred to as comparative inclination angles $\alpha 1$ and $\beta 1$.

Next, the control unit 102 determines whether it is necessary to readjust the inclination angle of the sample 122 (step S154).

For example, the control unit 102 determines whether an absolute value of a difference between the target inclination angle $\alpha 0$ and the comparative inclination angle $\alpha 1$ is smaller than a threshold value E and whether an absolute value of a difference between the target inclination angle $\beta 0$ and the comparative inclination angle $\beta 1$ is smaller than the threshold value E. When any one of the conditions described above is not satisfied, the control unit 102 determines that it is necessary to readjust the inclination angle of the sample 122. The threshold value E is an allowable error in the inclination angle of the sample 122, and can be set optionally.

Ideally, the crystal zone axis and the center of the primary beam are to coincide with each other. However, there is a case where the crystal zone axis and the center of the primary beam do not coincide with each other due to the adjustment accuracy of the sample stage 118, the error or the mistake in the result of the crystal zone axis detection processing, or the like. That is, the comparative inclination angles $\alpha 1$ and $\beta 1$ may not coincide with the target inclination angles $\alpha 0$ and $\beta 0$.

When it is determined that it is necessary to readjust the inclination angle of the sample 122, the control unit 102 sets the comparative inclination angles $\alpha 1$ and $\beta 1$ to the target inclination angles $\alpha 0$ and $\beta 0$ (step S155), and then returns to step S109.

When it is determined that it is not necessary to readjust the inclination angle of the sample 122, the control unit 102 ends the sample stage adjustment processing.

Depending on characteristics of the sample stage 118, the height of the sample 122 may move in conjunction with the change in the inclination angle. In particular, in a case of the inlens-type TEM 100, since the sample 122 is put in a center of a gap of the narrow objective lens 117, it is difficult to put a complicated eucentric mechanism, and in general, the height of the sample 122 is often changed in accordance with the change in the inclination angle of the sample 122.

Therefore, after the inclination angle of the sample 122 is changed (after the processing of step S155), the control unit 102 executes the processings of step S104 and step S105 according to a situation of the diffraction pattern including the Kikuchi line, and then acquires the diffraction pattern again.

According to the second embodiment, the control unit 102 can realize highly accurate adjustment of the inclination angle of the sample 122 by repeating the processing such that the crystal zone axis and the center of the primary beam coincide with each other.

Third Embodiment

When the crystal zone axis is largely deviated from the center of the diffraction pattern, there is a possibility that the crystal zone axis cannot be detected with high accuracy. Therefore, in a third embodiment, the control unit 102 calculates the crystal zone axis using a plurality of diffraction patterns. Hereinafter, the third embodiment will be described focusing on the differences from the first embodiment.

The configuration of the TEM 100 according to the third embodiment is the same as that of the first embodiment. In the third embodiment, the sample stage adjustment processing is different.

FIG. 11 is a flowchart showing the sample stage adjustment processing executed by the TEM 100 according to the third embodiment. FIG. 12 is a diagram showing an example of a series of the diffraction patterns acquired by the TEM 100 according to the third embodiment.

The processings from step S101 to step S105 are the same as the processings of the first embodiment.

After performing the defocusing, the control unit 102 acquires the series of the diffraction patterns having different inclination angles of the sample 122 (step S161).

For example, the control unit 102 changes the inclination angle of the sample 122 one degree at a time in a range of −2 degrees to +3 degrees, and acquires the diffraction patterns. When there are a plurality of inclination axes, the control unit 102 may acquire the series of the diffraction patterns for at least one inclination axis.

Depending on the characteristics of the sample stage 118, the height of the sample 122 may move in conjunction with the change in the inclination angle of the sample 122. In particular, in the case of the inlens-type TEM 100, since the sample 122 is put in the center of the gap of the narrow objective lens 117, it is difficult to put the complicated eucentric mechanism, and in general, the height of the sample 122 is often changed in accordance with the change in the inclination angle of the sample 122.

Therefore, after the inclination angle of the sample 122 is changed, the control unit 102 executes the processings of step S104 and step S105 according to the situation of the diffraction pattern including the Kikuchi line, and then acquires the diffraction pattern again.

FIG. 12 shows a series of a-axis diffraction patterns. As shown in FIG. 12, the crystal zone axis moves to the lower left as the inclination of the sample stage 118 (the inclination angle of the sample 122) increases.

Next, the control unit 102 selects a diffraction pattern to be processed from the acquired series of the diffraction patterns (step S162).

For example, the control unit 102 selects the diffraction patterns in ascending order of the inclination angles of the sample 122. A method of selecting a diffraction pattern is not limited in the invention.

Next, the control unit 102 executes the crystal zone axis detection processing for detecting the crystal zone axis from the selected diffraction pattern (step S107), and calculates the inclination angle of the sample 122 based on the detected crystal zone axis (step S108).

Next, the control unit 102 determines whether the processing is completed for all the diffraction patterns included in the series of the diffraction patterns (step S163).

When it is determined that the processing is not completed for all the diffraction patterns included in the series of the diffraction patterns, the control unit 102 returns to step S162 and executes the same processing.

When it is determined that the processing is completed for all the diffraction patterns included in the series of the diffraction patterns, the control unit 102 determines a final inclination angle based on the inclination angle of the sample 122 calculated based on each diffraction pattern included in the series of the diffraction patterns (step S164).

For example, since the centers of the primary beams of the diffraction patterns are at the same position, the control unit 102 determines an average value of the inclination angles of the sample 122 as the final inclination angle.

At this time, assuming that a series of fitting data (inclination angles) exists on a certain straight line, the control unit 102 may exclude an inclination angle having a large deviation amount from the average value and determine the average value of the remaining inclination angles as the final inclination angle. In this way, fitting that improves robustness is also possible.

Next, the control unit 102 moves the sample stage 118 based on the final inclination angle (step S109), and then ends the sample stage adjustment processing.

The processing of step S109 is the same as that of the first embodiment. The control unit 102 may move the sample stage 118 such that a moving direction is always constant in consideration of a backlash of the sample stage 118.

According to the third embodiment, the control unit 102 can automatically adjust the inclination angle of the sample 122 with high accuracy.

Fourth Embodiment

In a fourth embodiment, an image when the sample 122 is observed by using the electron microscope having a function of automatically adjusting the inclination angle of the sample 122 described in the first to third embodiments will be described. Here, a case of observing the semiconductor device as the sample 122 will be described.

The semiconductor device is manufactured by forming a fine structure on a wafer serving as a substrate. In order to form the fine structure, processes such as etching and vapor deposition are performed. In a development of the semiconductor device, the semiconductor device is observed using the electron microscope in order to perform a length measurement of the fine structure, an inspection of defects, and the like.

FIG. 13 is a diagram showing a relationship between the primary beam and the semiconductor device observed by the electron microscope according to the fourth embodiment. FIG. 14A and FIG. 14B are diagrams showing an example of the image when the semiconductor device is observed using the electron microscope according to the fourth embodiment.

In general, a semiconductor device 1300 is picked up by selecting a device position requiring observation using a focused ion beam apparatus or the like, and has a thickness of 50 nm to 100 nm.

In FIG. 13, the semiconductor device 1300 is irradiated with a primary beam 1301 from above. Here, since the scanning transmission electron microscopy is assumed, it is assumed that the primary beam 1301 is emitted so as to converge on the sample 122. The semiconductor device 1300 is set on the sample stage 118 so as to be perpendicular to the primary beam 1301.

When the crystal orientation of the semiconductor device does not coincide with the primary beam, that is, when the semiconductor device 1300 is not perpendicular to the primary beam 1301, an image of a structure in a thickness direction of the semiconductor device 1300 is integrated. Therefore, a blurred sample image as shown in FIG. 14A is acquired from the electron microscope. In this case, even when optical conditions of the primary beam are adjusted and a narrowed primary beam is emitted, a sample image with high resolution cannot be obtained.

When the crystal orientation of the semiconductor device coincides with the primary beam, that is, when the semiconductor device 1300 is perpendicular to the primary beam 1301, a clear sample image as shown in FIG. 14B is acquired from the electron microscope.

A feature of the semiconductor device is that a structure can be formed in accordance with the crystal orientation of the wafer. Even when a structure to be observed is amorphous and the diffraction pattern cannot be obtained, by using the diffraction pattern obtained from Si crystals that constitute the wafer, the crystal orientation of the sample can be automatically adjusted such that the clear sample image can be obtained.

The invention is not limited to the above-mentioned embodiments, and includes various modifications. For example, the embodiments described above have been described in detail for easy understanding of the invention, and the invention is not necessarily limited to those including all the configurations described above. Apart of the configuration of the embodiment may be deleted and may be added and replaced with another configuration.

Each of the configurations, functions, processing units, processing methods or the like described above may be implemented by hardware by designing a part or all of them with, for example, an integrated circuit. Further, the invention can also be implemented by program code of software that implements the functions of the embodiment. In this case, a storage medium recording the program code is provided to a computer, and a processor included in the computer reads out the program code stored in the storage medium. In this case, the program code itself read out from the storage medium implements the functions of the above embodiment, and the program code itself and the storage medium storing the program code constitute the invention. As a storage medium for supplying such a program code, for example, a flexible disk, a CD-ROM, a DVD-ROM, a hard disk, a solid state drive (SSD), an optical disk, a magneto-optical disk, a CD-R, a magnetic tape, a nonvolatile memory card, or a ROM is used.

Further, the program code that implements the functions described in the present embodiment can be implemented in a wide range of programs or script languages such as assembler, C/C++, perl, Shell, PHP, Python, and Java.

Further, the program code of the software that implements the function of the embodiments may be stored in a storage device such as a hard disk or a memory of a computer or a storage medium such as a CD-RW or a CD-R by delivering via a network, and a processor included in the computer may read out and execute the program code stored in the storage device or the storage medium.

In the embodiments described above, control lines and information lines are considered to be necessary for description, and all control lines and information lines are not necessarily shown in the product. All configurations may be connected to each other.

The invention claimed is:

1. A charged particle beam apparatus that irradiates a sample with a charged particle beam to observe the sample, the charged particle beam apparatus comprising:
   a sample stage that is configured to hold and move the sample;
   a particle source configured to output the charged particle beam;
   a plurality of lenses configured to adjust an irradiation direction and focus of the charged particle beam on the sample;
   a detector configured to detect a signal emitted from the sample irradiated with the charged particle beam; and
   a processor that is communicatively coupled to the sample stage, the particle source, the plurality of lenses, and the detector, wherein the processor is configured to:
   control the particle source to output the charged particle beam,
   acquire, using the detector, a diffraction pattern for the charged particle beam, wherein the diffraction pattern includes a plurality of Kikuchi lines,
   calculate a crystal zone axis of the sample by performing analysis based on a plurality of intersections at which two Kikuchi lines included in the diffraction pattern intersect with each other,
   calculate an inclination angle, which is an angle at which the sample is inclined, based on the crystal zone axis and the irradiation direction of the charged particle beam,
   move, using the sample stage, the sample to a new location based on the inclination angle, and
   obtain, using the detector, an image of the sample at the new location.

2. The charged particle beam apparatus according to claim 1, wherein the processor is further configured to
   calculate a center and a radius of an inscribed circle for each of a plurality of triangles formed by the intersections of the plurality of Kikuchi lines, and
   calculate the crystal zone axis of the sample based on the center and the radius of the inscribed circle.

3. The charged particle beam apparatus according to claim 2, wherein the processor is further configured to
   select the inscribed circle to be used for processing based on a distribution of centers of a plurality of inscribed circles and each radius of the plurality of inscribed circles.

4. The charged particle beam apparatus according to claim 1, wherein The processor is further configured to:
   calculate, as the crystal zone axis of the sample, a coordinate at which a sum of distances from the plurality of intersections is minimized.

5. The charged particle beam apparatus according to claim 1, wherein the processor is further configured to
   acquire the diffraction pattern after changing the focus of the plurality of lenses.

6. The charged particle beam apparatus according to claim 1, wherein the processor is further configured to control the plurality of lenses such that the charged particle beam is emitted to scan a partial region of the sample.

7. The charged particle beam apparatus according to claim 1, wherein
   the sample is a semiconductor device, and
   the image represents a structure of the semiconductor device.

8. A method of controlling a charged particle beam apparatus that irradiates a sample with a charged particle beam to observe the sample,
   the method comprising:
   controlling, by a processor of the charged particle beam apparatus, a particle source to output the charged particle beam,
   acquiring, by the processor, a diffraction pattern for the charged particle beam, where in the diffraction pattern includes a plurality of Kikuchi lines;
   calculating, by the processor, a crystal zone axis of the sample by performing analysis based on a plurality of intersections at which two Kikuchi lines included in the diffraction pattern intersect with each other;
   calculating, by the processor, an inclination angle, which is an angle at which the sample is inclined, based on the crystal zone axis and an irradiation direction of the charged particle beam;
   moving, by the processor, the sample to a new location based on the inclination angle; and
   obtain, by the processor, an image of the sample at the new location.

9. The method according to claim 8, further comprising:
   calculating, by the processor, a center and a radius of an inscribed circle for each of a plurality of triangles formed by the intersections of the plurality of Kikuchi lines, and calculating, by the processor, the crystal zone axis of the sample based on the center and the radius of the inscribed circle.

10. The method according to claim 9, further comprising selecting, by the processor, the inscribed circle to be used for processing based on a distribution of centers of a plurality of inscribed circles and each radius of the plurality of inscribed circles.

11. The method according to claim 8, further comprising: calculating, by the processor, as the crystal zone axis of the sample, a coordinate at which a sum of distances from the plurality of intersections is minimized.

12. The method according to claim 8, further comprising: acquiring, by the processor, the diffraction pattern after changing the focus of a plurality of lenses.

13. The method according to claim 8, further comprising controlling, by the processor, a plurality of lenses such that the charged particle beam is emitted to scan a partial region of the sample.

14. The method according to claim 8, wherein
the sample is a semiconductor device, and
the image representing a structure of the semiconductor device.

\* \* \* \* \*